(12) United States Patent
Yoshimura

(10) Patent No.: US 7,161,195 B2
(45) Date of Patent: Jan. 9, 2007

(54) SEMICONDUCTOR DEVICE AND FABRICATION PROCESS THEREOF

(75) Inventor: Tetsuo Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 70 days.

(21) Appl. No.: 10/973,440

(22) Filed: Oct. 27, 2004

(65) Prior Publication Data
US 2005/0282386 A1    Dec. 22, 2005

(30) Foreign Application Priority Data
Jun. 16, 2004   (JP) ............................. 2004-178442

(51) Int. Cl.
*H01L 27/10* (2006.01)
(52) U.S. Cl. .................. 257/211; 257/208; 257/207; 257/206; 438/598; 438/618
(58) Field of Classification Search ............... 257/208, 257/211, 207; 438/597, 598, 618
See application file for complete search history.

(56) References Cited

U.S. PATENT DOCUMENTS 6,255,702 B1 *  7/2001  Iwata et al. .................. 257/384
2002/0142540 A1 * 10/2002  Katayama .................... 438/239

FOREIGN PATENT DOCUMENTS

| JP | 10-12745 | 1/1998 |
|---|---|---|
| JP | 10-74846 | 3/1998 |
| JP | 11-26767 | 1/1999 |

* cited by examiner

*Primary Examiner*—Brook Kebede
*Assistant Examiner*—Su C. Kim
(74) *Attorney, Agent, or Firm*—Westerman, Hattori, Daniels & Adrian, LLP.

(57) ABSTRACT

A semiconductor device includes a substrate having first and second device regions separated from each other by a device isolation region, a first field effect transistor having a first polysilicon gate electrode and formed in the first device region, a second field effect transistor having a second polysilicon gate electrode and formed in the second device region, a polysilicon pattern extending over the device isolation region from the first polysilicon gate electrode to the second polysilicon gate electrode, and a silicide layer formed on a surface of the first polysilicon gate electrode, a surface of said the polysilicon gate electrode and a surface of the polysilicon pattern so as to extend on the polysilicon pattern from the first polysilicon gate electrode to the second polysilicon gate electrode, the silicide layer having a region of increased film thickness on the polysilicon pattern, wherein the silicide layer has a surface protruding upward in the region of increased film thickness.

7 Claims, 9 Drawing Sheets

--Prior Art--

--Prior Art--

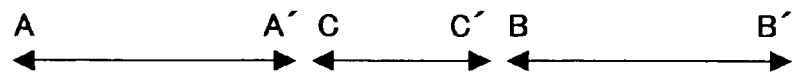

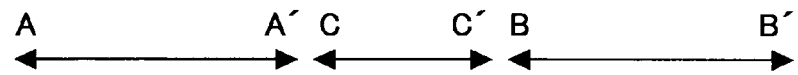

COBALT SILICIDE FILM THICKNESS
= METAL COBALT FILM THICKNESS × 3

SEMICONDUCTOR DEVICE AND FABRICATION PROCESS THEREOF

CROSS-REFERENCE TO RELATED APPLICATION

The present application is based on Japanese priority application No. 2004-178442 filed on Jun. 16, 2004, the entire contents of which are hereby incorporated by reference.

BACKGROUND OF THE INVENTION

The present invention generally relates to semiconductor devices and more particularly to a semiconductor device having polysilicon wiring.

A CMOS device is a semiconductor device comprising a p-channel MOS transistor and an n-channel MOS transistor formed on a common semiconductor substrate and has a construction in which respective polysilicon gate electrodes are connected with each other.

With the CMOS device of such a construction, the gate electrode of the p-channel MOS transistor and the gate electrode of the n-channel MOS transistor are formed respectively of p-type and n-type polysilicon having a generally equal work function, and thus, an advantageous feature of the p-channel MOS transistor and the n-channel MOS transistor having generally equal threshold characteristics is attained.

REFERENCES (Patent Reference 1) Japanese Laid Open Patent Application 10-12745 official gazette
(Patent Reference 2) Japanese Laid Open Patent Application 10-74846 official gazette
(Patent Reference 3) Japanese Laid Open Patent Application 11-26767 official gazette

SUMMARY OF THE INVENTION

In recent high-speed or ultrahigh speed CMOS devices, the thickness of the gate insulation film is reduced to 2 nm or less according to the scaling low with miniaturization of the p-channel or n-channel MOS transistor constituting the CMOS device.

In such high-speed or ultrahigh speed CMOS devices, on the other hand, it is practiced to form a low-resistance silicide layer on the surface of the polysilicon gate electrode and on the surface of the source and drain regions in order to reduce the gate resistance and to reduce the contact resistance of the source and drain regions. It should be noted that such a silicide layer is formed also on the polysilicon pattern connecting the gate electrode of the p-channel MOS transistor and the gate electrode of the n-channel MOS transistor. Generally, such a silicide layer is formed by a so-called salicide process in which a metal film is deposited on the silicon substrate so as to cover the polysilicon gate electrode and the source and the drain regions and silicide is formed by causing the metal film thus deposited to react with the polysilicon pattern constituting the gate electrode and the part of the silicon substrate constituting the source and drain regions.

FIGS. 1A and 1B show the construction of such a conventional CMOS device 10, wherein FIG. 1A shows the CMOS device 10 in a plan view while FIG. 1B shows the same device in a cross-sectional view.

Referring to FIGS. 1A and 1B, the CMOS device 10 is formed on a silicon substrate 11 wherein the silicon substrate 11 is formed with a device region 11A for the p-channel MOS transistor 10A and a device region 11B for the n-channel MOS transistor 10B separated from each other by a device isolation structure 12.

It should be noted that the p-channel MOS transistor 10A includes a gate electrode 14A formed on the silicon substrate 11 via a gate insulation film 13A in the device region 11A, and a silicide layer 14a is formed on the gate electrode 14A. Further, in the device region 11A, p-type diffusion regions 11a and 11b are formed in the silicon substrate 11 at both lateral sides of the gate electrode 14A, and silicide layers 11c and 11d are formed on the respective surfaces of the p-type diffusion regions 11a and 11b.

Similarly, the n-channel MOS transistor 10B includes, in the device region 11B, a gate electrode 14B formed on the silicon substrate 11 via a gate insulation film 13B, and a silicide layer 14b is formed on the gate electrode 14B. Further, in the device region 11B, there are formed n-type diffusion regions 11e and 11f in the silicon substrate 11 at both lateral sides of the gate electrode 14B, and silicide layers 11g and 11h are formed on the respective surfaces of the p-type diffusion regions 11e and 11f.

As can be seen from the plan view of FIG. 1A, the gate electrode 14A and the gate electrode 14B are connected with each other by a polysilicon pattern 14C extending over the device isolation structure 12, and a silicide layer 14c is formed on the polysilicon pattern 14C in continuation with the silicide layers 14a and 14b. Thereby, the gate electrode 14A is doped to the p-type and the gate electrode 14B is doped to the n-type, while the polysilicon pattern 14C is undoped except of the parts connected to the gate electrode 14A and the gate electrode 14B.

In the cross-sectional diagram of FIG. 1B, there is further formed an interlayer insulation film 15 on the substrate 11 so as to cover the gate electrodes 14A and 14B and further the polysilicon pattern 14C, and contact plugs 16A, 16B, 16C and 16D are formed in the interlayer insulation film in contact with the diffusion regions 11a, 11b, 11e and 11f respectively, via respective silicide layers 11c, 11d, 11g and 11h.

In such a CMOS device, on the other hand, there is a need of decreasing the thickness of the gate insulation films 13A and 13B in correspondence to the gate length thereof in the case the gate length of the p-channel MOS transistor 10A or the n-channel MOS transistor 10B is decreased for improvement of the operational speed. Associated with this, the thickness of the gate electrodes 13A and 13B, and hence the height thereof, is reduced, and as a result, there can occur the problem that the metal film deposited at the time of formation of the silicide layer 14a comes close the gate insulation film 13A and the metal film deposited at the time of formation of the silicide layer 14b comes close to the gate insulation film 13B. In such a case, there can occur diffusion of metal element from the metal film into the gate insulation film 13A or 13B, leading to formation of defects in the gate insulation film 13A or 13B. Further, associated with such formation of defects in the gate insulation film 13A or 13B, there arises a problem of increase of occurrence of so-called B-mode failure in which the lifetime of the semiconductor device is reduced with increase of the gate leakage current.

In order to avoid such B-mode failure, it is conceivable to reduce the thickness of the metal film deposited at the time of formation of the silicide layer in such a salicide process, while such an approach can lead to localized formation of region 14x lacking silicide as shown in FIGS. 2A and 2B. In FIGS. 2A and 2B, it should be noted that those parts corresponding to the parts described previously are designated by the same reference numerals and the description thereof will be omitted.

When such a region 14x lacking silicide is formed on the polysilicon gate electrode 14A or 14B doped heavily to the p-type or n-type and thus having a sheet resistance of several ten $\Omega/\square$ or so, the electric current flowing therein avoids such a region 14x not formed with silicide and flows through the polysilicon pattern constituting the gate electrode 14A or 14B. Because of this, no particular problem such as disconnection or remarkable increase of resistance is caused. In the case the region 14x lacking silicide is formed on the non-doped polysilicon pattern 14C extending over the device isolation region 12, on the other hand, there is formed no alternative current path in view of the fact that the polysilicon layer underneath the silicide layer 14c has a very large sheet resistance of several M$\Omega/\square$, and there can be caused a serious problem such as disconnection or increase of resistance.

Contrary to this, Patent Reference 1 discloses the technology for avoiding the problem of FIGS. 2A and 2B by increasing the thickness of the silicide layer on the non-doped polysilicon pattern as compared with the silicide layer formed on the p-type or n-type pattern, by utilizing the phenomenon that the titanium silicide layer formed by a salicide process takes different thicknesses between the cases in which the silicide layer is formed on a non-doped polysilicon pattern and in which the silicide layer is formed on a doped polysilicon pattern doped to p-type or n-type.

FIG. 3 shows the construction of the polysilicon pattern according to the foregoing Patent Reference 1.

Referring to FIG. 3, there are formed device regions 1A and 1B on a silicon substrate 1 by an insulating device isolation film 2, and a polysilicon pattern 3 is formed on the silicon substrate 1 via a gate insulation film not illustrated, such that the polysilicon pattern 3 extends over the device isolation film 2 from the device region 1A to the device region 1B. It should be noted that the polysilicon pattern 3 is doped to the p-type or n-type in the device region 1A and to the opposite conductivity type in the device region 1B. On the other hand, the polysilicon pattern 3 is not doped on the device isolation film 2.

In the case a titanium silicide film 4 is formed on such a polysilicon pattern 3 by a salicide process, on the other hand, the titanium silicide film 4 is formed with an increased thickness in the region 4A thereof because of the fact that the polysilicon pattern 3 is not doped on the device isolation film 2, and it becomes possible to decrease the thickness of the metal titanium film deposited at the time of forming the titanium silicide film by a salicide process.

However, this conventional technology, utilizing the natural effect of doping of the underlying polysilicon pattern for the formation of silicide, can cause only the thickness change of several ten Angstroms (several nanometers) for the titanium silicide layer 4 in correspondence to the region 4A. Obviously, the thickness change caused with this magnitude is insufficient at all for avoiding the discontinuity or disconnection of the silicide layer 4 on the device isolation film 2.

In a first aspect of the present invention, there is provided a semiconductor device, comprising:

a substrate having first and second device regions separated from each other by a device isolation region;

a first field effect transistor having a first polysilicon gate electrode and formed in said first device region;

a second field effect transistor having a second polysilicon gate electrode and formed in said second device region;

a polysilicon pattern extending over said device isolation region from said first polysilicon gate electrode to said second polysilicon gate electrode; and a silicide layer formed on a surface of said first polysilicon gate electrode, a surface of said second polysilicon gate electrode and a surface of said polysilicon pattern so as to extend on said polysilicon pattern from said first polysilicon gate electrode to said second polysilicon gate electrode, said silicide layer having a region of increased film thickness on said polysilicon pattern, wherein said silicide layer has a surface protruding upward in said region of increased film thickness.

In another aspect of the present invention, there is provided a semiconductor device, comprising:

a substrate having a device region defined by a device isolation region;

a field effect transistor having a polysilicon gate electrode and formed on said device region;

a polysilicon pattern extending out from said polysilicon gate electrode and extending over said device isolation region; and a silicide layer formed on a surface of said polysilicon gate electrode and on a surface of said polysilicon pattern so as to extend over said polysilicon pattern from said polysilicon gate electrode, said silicide layer including a region of increased film thickness on said polysilicon pattern, said silicide layer having a surface protruding upward in said region of increased film thickness.

Another object of the present invention is to provide a method of fabricating a semiconductor device, comprising the steps of:

forming, on a substrate including a device region device by a device isolation region, a field effect transistor in corresponding to said device region, such that a polysilicon pattern extends out from a polysilicon gate electrode of said field effect transistor, such that said polysilicon pattern extends over said device isolation region;

depositing a metal film on said substrate so as to cover said gate electrode and said polysilicon pattern;

forming a mask pattern on said metal film so as to cover a part of said polysilicon pattern existing on said device isolation region;

etching said metal film while using said mask pattern as a mask so as to reduce a thickness of said metal film in a part thereof not covered with said mask pattern; and forming a silicide layer on a surface of said gate electrode and a surface of said polysilicon pattern by applying an annealing process after removing said mask pattern.

According to the present invention, the thickness of the silicide layer is increased in the polysilicon pattern extending from a polysilicon gate electrode even in the case the silicide layer itself is formed on the polysilicon gate electrode with an extremely small thickness by a salicide process, and it becomes possible to reduce the occurrence of B-mode failure drastically. Further, at the same time, it becomes possible to suppress the occurrence of the problem such as disconnection or increase of the resistance. Thus, according to the present invention, it becomes possible to miniaturize a semiconductor device such as a CMOS device such that the thickness of the gate insulation film of the MOS transistor is reduced to 2 nm or less and such that the gate length is reduced to 130 nm or less.

According to the present invention, in particular, it becomes possible to suppress the occurrence of the B-mode failure substantially to zero and simultaneously the occurrence of defective operation of the semiconductor device caused by failure of silicide formation also substantially to zero, by setting the thickness of the metal film on the gate electrode to 8 nm or less and by setting the thickness of the metal film on the polysilicon pattern extending out from the gate electrode to 10 nm or more at the time of formation of the silicide layer by a salicide process.

Other objects and further features of the present invention will become apparent from the following detailed description when read in conjunction with the attached drawings.

DETAILED DESCRIPTION OF THE INVENTION

Figure 4:
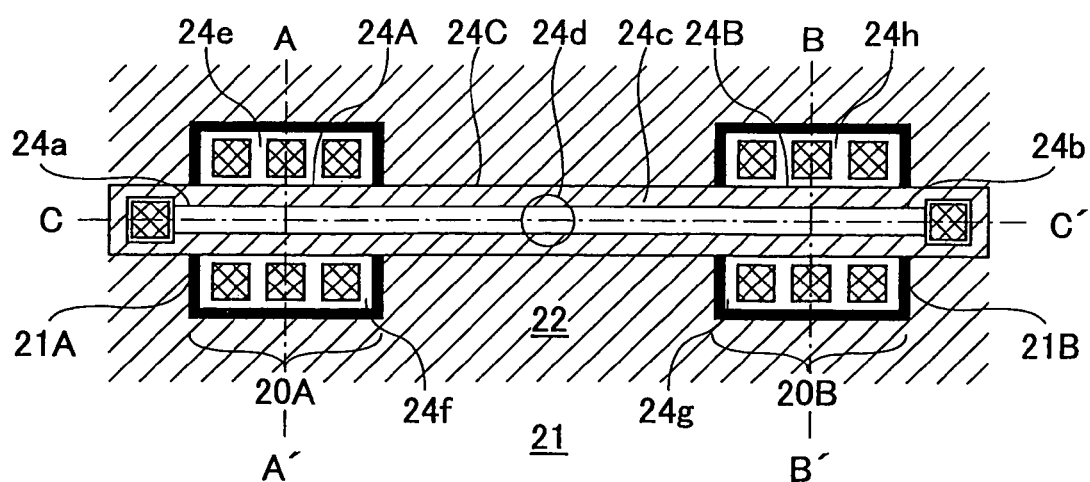
FIG. 4 is a plan view diagram showing the construction of a CMOS device according to an embodiment of the present invention.

FIG. 4 is a diagram showing a schematic construction of a CMOS device 20 according to a first embodiment of the present invention in a plan view.

Referring to FIG. 4, the CMOS device comprises a silicon substrate 21 formed with device regions 21A and 21B in such a manner that the device regions 21A and 21B are isolated from each other by an insulating device isolation film 22, and a p-channel MOS transistor 20A having a polysilicon gate electrode 24A doped to the p-type and an n-channel MOS transistor 20B having a polysilicon gate electrode 24B doped to the n-type are formed respectively in the device region 21A and in the device region 21B, such that the gate electrodes 24A and 24B are connected by a polysilicon pattern 24C extending over the device isolation film 22.

Further, in the construction of FIG. 4, there is formed a thin cobalt silicide layer 24a on the polysilicon gate electrode 24A, and a thin cobalt silicide layer 24b is formed on the polysilicon gate electrode 24B. Further, a thin cobalt silicide layer 24c is formed on the polysilicon pattern 24C in continuation with the cobalt silicide layer 24a and the cobalt silicide layer 24b.

Further, there are formed silicide layers 24e and 24f in the device region 20A at both lateral sides of the gate electrode 24A respectively in correspondence to the source region and the drain region of the p-channel MOS transistor 20A. In the device region 20B, on the other hand, there are formed silicide layers 24g and 24h respectively in correspondence to the source region and the drain region of the n-channel MOS transistor 20B.

Further, in the CMOS device 20 of the present embodiment, it should be noted that there is formed a region 24d of increased thickness in a part of the polysilicon pattern 24C intermediate to the transistor 20A and the transistor 20B such that there occurs an increase of thickness of the silicide layer 24c in such a region 24d of increased thickness.

Hereinafter, the fabrication process of the CMOS device 20 of FIG. 4 will be explained with reference to FIGS. 5A–5J, wherein it should be noted that these drawings represent the cross-sectional diagrams taken along the lines A–A', C–C' and B–B' of the plan view of FIG. 4.

Figure 5A:
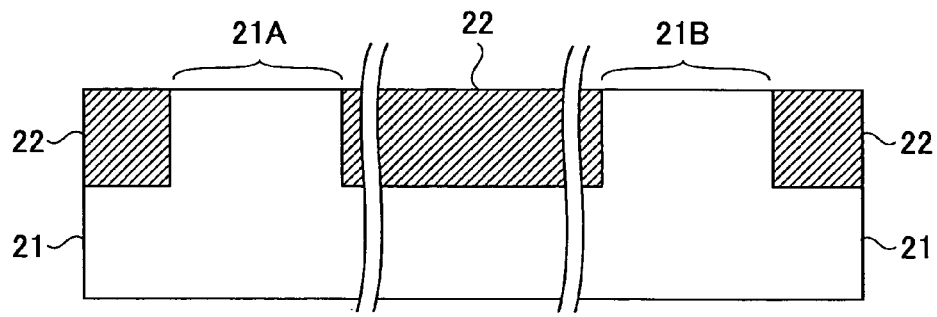
FIGS. 5A–5J are diagrams showing the fabrication process of the CMOS device of FIG. 4.
Figure 5B:
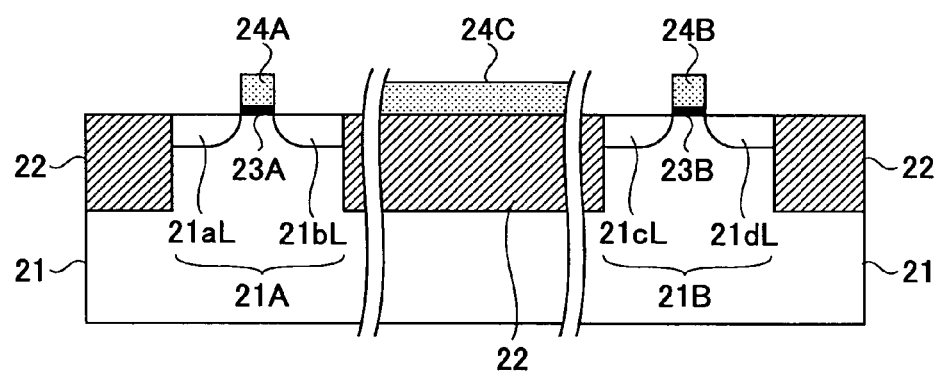

Referring to FIG. 5A, the device isolation film 22 forms an STI (shallow trench isolation) structure on the silicon substrate 21, and gate insulation films 23A and 23B are formed in the step of FIG. 5B respectively on the device region 21A and 21B by an oxide film or an oxynitride film with a thickness of 2 nm or less.

In the step of FIG. 5A, it should be noted that there is formed an n-type well (not shown) in the device region 21A by introducing As+ or P+ with an impurity concentration level of $1\times10^{13}$ cm$^{-3}$ by a ion implantation process. Similarly, there is formed a p-type well (not shown) in the device region 21B by introducing B+ or BF$_2$+ with an impurity concentration level of $1\times10^{13}$ cm$^{-3}$ by an ion implantation process.

Next, in the step of FIG. 5B, a polysilicon film is deposited on the substrate 21 thus formed with the gate insulation films 23A and 23B, uniformly with the thickness of about 180 nm, and the gate electrodes 24A and 24B are formed respectively in the device regions 21A and 21B as a result of patterning of the polysilicon film. Further, as a result of the patterning of the polysilicon film, the polysilicon pattern 24C is formed on the device isolation film 22 at the same time. In the present embodiment, it should be noted that the polysilicon film is patterned such that the p-channel MOS transistor 20A and the n-channel MOS transistor 20B have a gate length of 130 nm or less.

After the step of FIG. 5B, an ion implantation process of B+ is conducted in the state that the device region 21B is covered with the resist pattern with an impurity concentration level of $1\times10^{14}$ cm$^{-3}$ while using the gate electrode 24A as a self-aligned mask, and as a result, there are formed p-type LDD regions 21aL and 21bL in the device region 21A at both lateral sides of the gate electrode 24A. Further, by conducting an ion implantation process of As+ or P+ into the device region 21B while using the gate electrode 24B as a self-aligned mask in the state that the device region 21A is covered with a resist pattern, there are formed n-type LDD regions 21cL and 21dL in the device region 21B at both lateral sides of the gate electrode 24B.

Figure 5C:
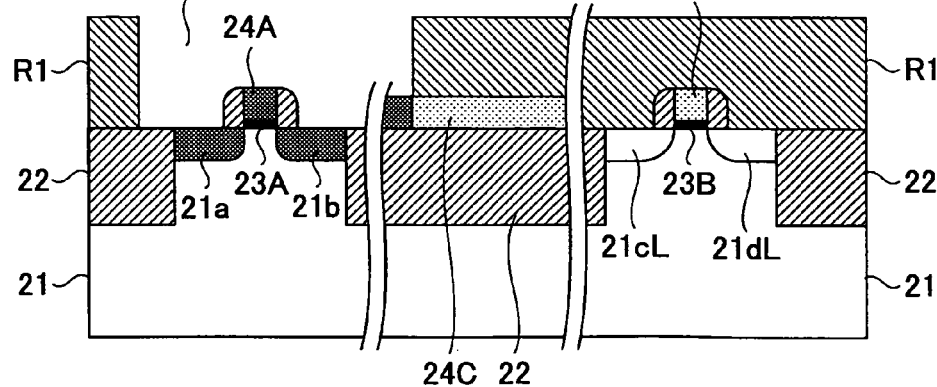

Next, in the step of FIG. 5C, a sidewall insulation film is formed on both sidewall surfaces of the gate electrodes 24A and 24B, and a resist pattern R1 having a resist window exposing the device region 21A is formed on the substrate 21. Further, ion implantation process of B+ is conducted into the device region 21A with an impurity concentration level of $1\times10^{15}$ cm$^{-3}$ while using the resist pattern R1 as a mask. Thereby, there are formed p-type diffusion regions 21a and 21b in a partially overlapping relationship with the p-type LDD regions 21aL and 21bL formed previously, as the source region and the drain region of the p-channel MOS transistor 20A. As a result of the process of FIG. 5C, it should be noted that, although not illustrated, there is formed a similar sidewall insulation film also on both sidewall surfaces of the polysilicon pattern 24C.

Figure 5D:
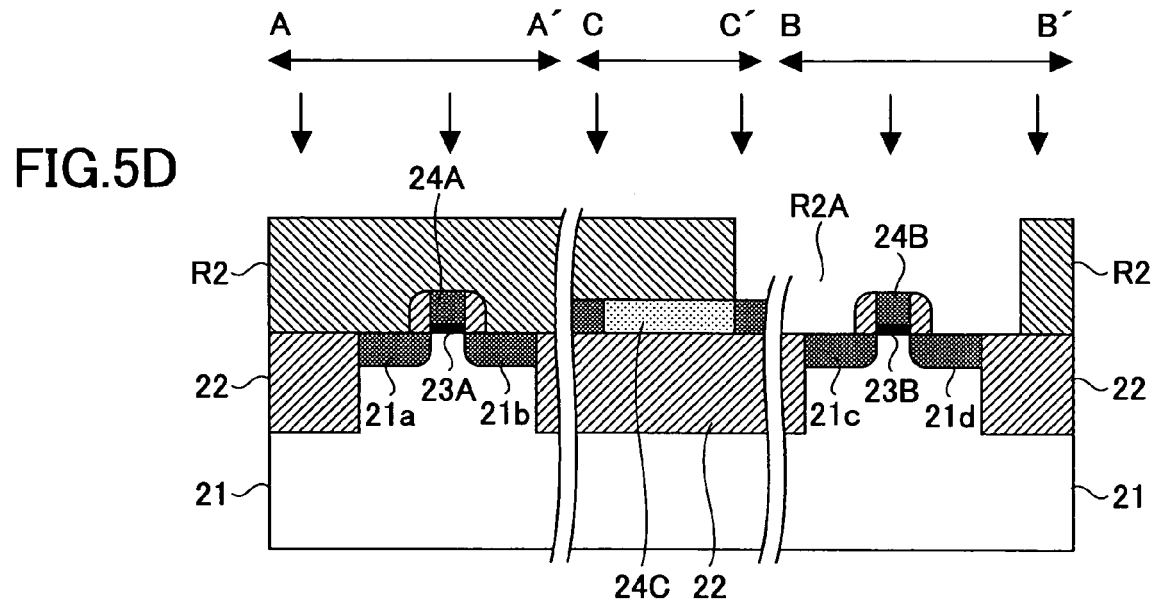

Next, in the step of FIG. 5D, the resist pattern R1 is removed and a resist pattern R2 having a resist window exposing the device region 21B is formed on the substrate 21. Further, ion implantation of As+ or P+ is conducted into the device region 21A with an impurity concentration level of $1\times10^{15}$ cm$^{-3}$ while using the resist pattern R2 as a mask, and there are formed n-type diffusion regions 21c and 21d in a partially overlapping relationship with the n-type LDD regions 21cL and 21dL as the source region and drain region of the n-channel MOS transistor 20B.

With this ion implantation process of FIGS. 5C and 5D, the part of the polysilicon pattern 24C close to the gate electrode 24A is doped to the p-type and the part of the polysilicon pattern 24C close to the gate electrode 24B is doped to the n-type. On the other hand, the intermediate part of the polysilicon pattern 24C is not doped and maintains the undoped state.

Figure 5E:
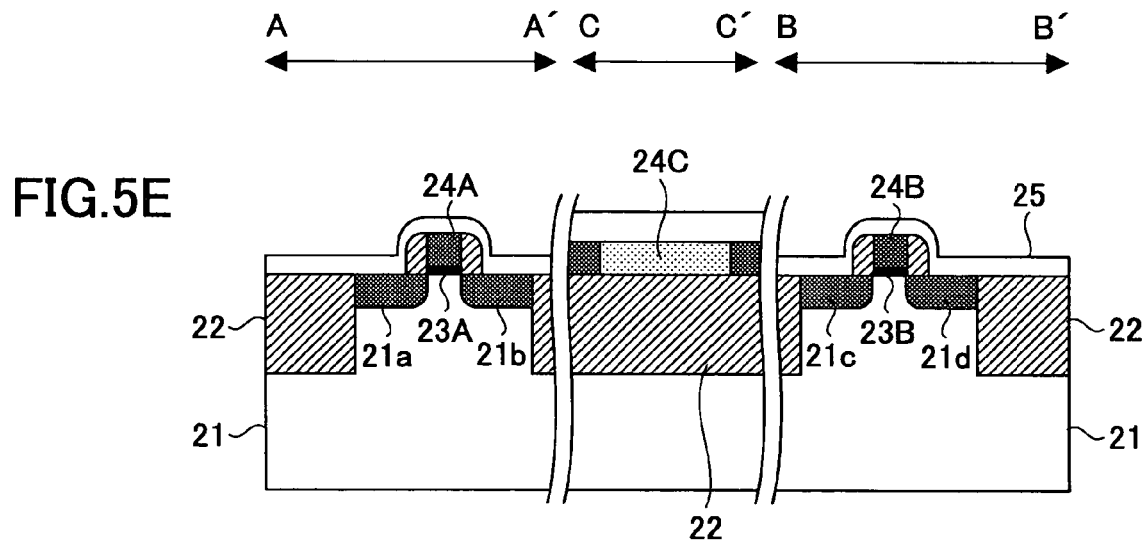

Next, in the step of FIG. 5E, the resist pattern R2 is removed and a metallic cobalt film 25 is deposited on the substrate 21 by a sputtering process, and the like, uniformly with a thickness of about 10 nm, such that the cobalt film 25 covers the gate electrodes 24A and 24B.

Figure 5F:
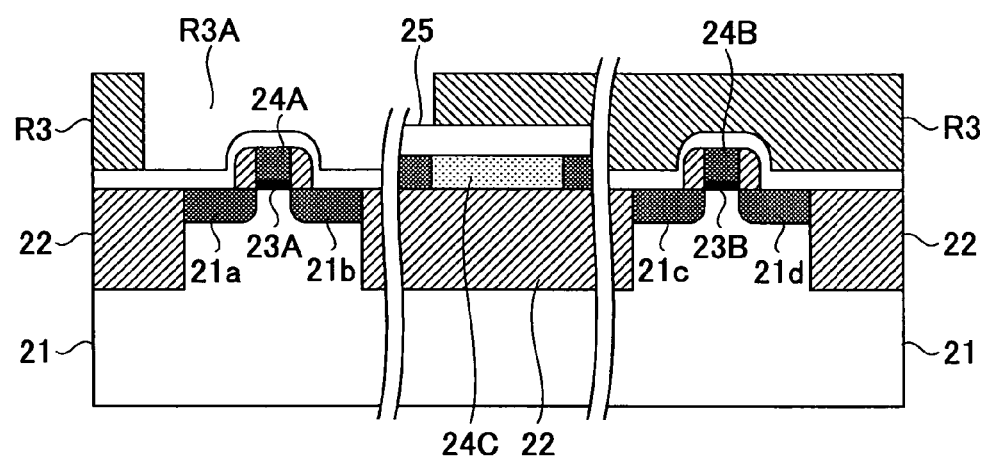

Next, in the step of FIG. 5F, a resist film is formed on the structure of FIG. 5D, wherein the resist film is exposed by using an exposure mask used in the step of FIG. 5C for exposing the resist pattern R1. Further, by developing the resist film thus exposed, there is formed a resist pattern R3 having a resist window R3A such that the resist window R3A exposes the device region 21A.

Figure 5G:
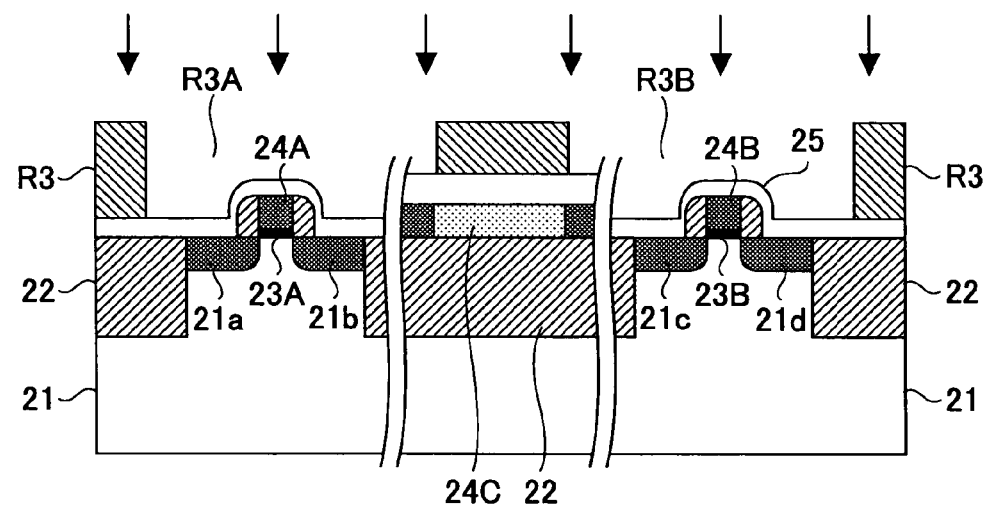

Next, in the step of FIG. 5G, the same resist pattern R3 is exposed by using an exposure mask used at the time of exposing the resist pattern R2 for use in the step of FIG. 5D. After development, there is formed a resist window R3B exposing the device region 21B in the resist pattern R3, in addition to the foregoing resist window R3A. Further, in the step of FIG. 5G, the metallic cobalt film 25 is etched with a depth of about 2 nm for the part exposed by the resist openings R3A and R3B while using the resist pattern R3 as a mask.

Figure 5H:
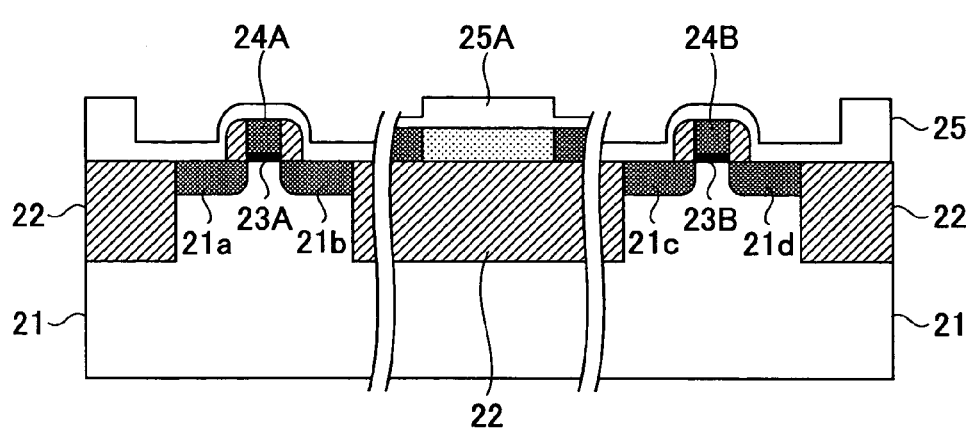

Because there occurs no etching in the metallic cobalt film 25 in this process for the part covered with the resist pattern R3, there is formed a structure shown in FIG. 5H when the resist pattern R3 is removed, wherein it will be noted that there is formed a protruding part in the metallic cobalt film 25 in correspondence to the non-doped part of the polysilicon pattern such that the metallic cobalt film 25 has an increased thickness in the non-doped part. In the step of FIG. 5H, it should be noted that the thickness of the metallic cobalt film 25 thus deposited is reduced to about 8 nm or less in the part covering the gate electrode 24A or 24B as a result of the etching conducted while using the resist pattern R3 as a mask. On the other hand, the metallic cobalt film 25 maintains the initial thickness of 10 nm on the part covering the polysilicon pattern 24C.

Thus, by applying an annealing process to the structure of FIG. 5H at the temperature of 850° C., the metallic cobalt film 25 causes a reaction with a silicon surface in the part where such a silicon surface is exposed underneath the metallic cobalt film 25, and as a result, the silicide layers 21e and 21f are formed on the surface of the diffusion regions 21a and 21b and the silicide layers 21g and 21h are formed on the surface of the diffusion regions 21c and 21d. Further, the silicide layers 24a and 24b are formed on the gate electrodes 24A and 24B and the silicide layer 24c is formed on the polysilicon pattern 24C, wherein it will be noted that the silicide layer 24 thus formed includes the region 24d of increased thickness as shown in FIG. 6 in correspondence to the region 25A of increased thickness of the cobalt film 25.

Figure 6:
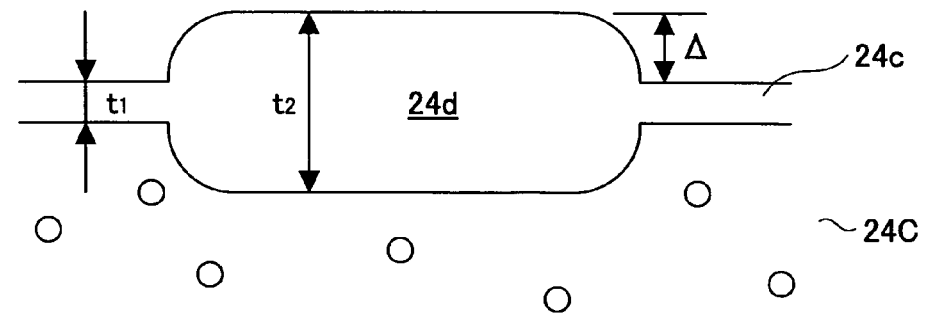
FIG. 6 is a diagram showing a part of FIG. 5I in an enlarged scale.

Referring to FIG. 6, it should be noted that the silicide layer 24c formed with such a process has a thickness t1 smaller than 24 nm on the polysilicon pattern 24C, while the thick region 24d of the silicide layer is formed with a thickness t2 of 30 nm or more. Further, according to the present invention, the thick region 24d forms a protrusion having a step height Δ in correspondence to the protrusion 25A of the metallic cobalt film 25, wherein it should be noted that the thickness t1 is equal to the thickness of the silicide film formed on the gate electrode 24A or 24B.

Figure 5I:
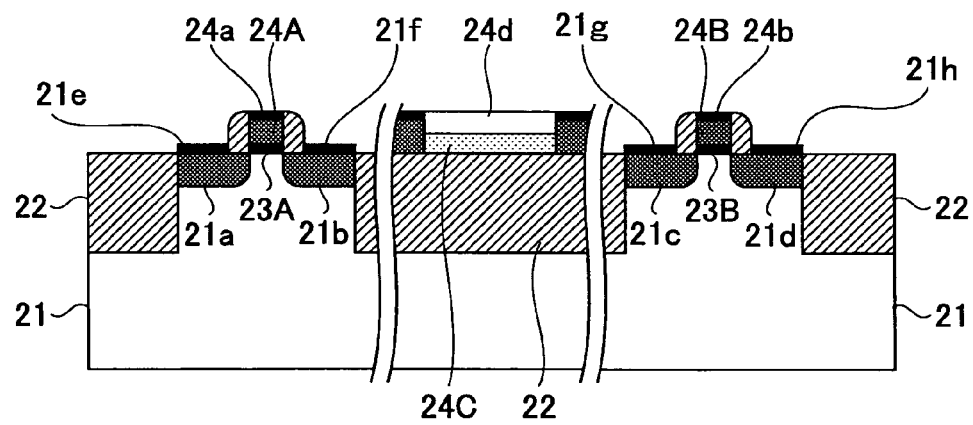
Figure 5J:
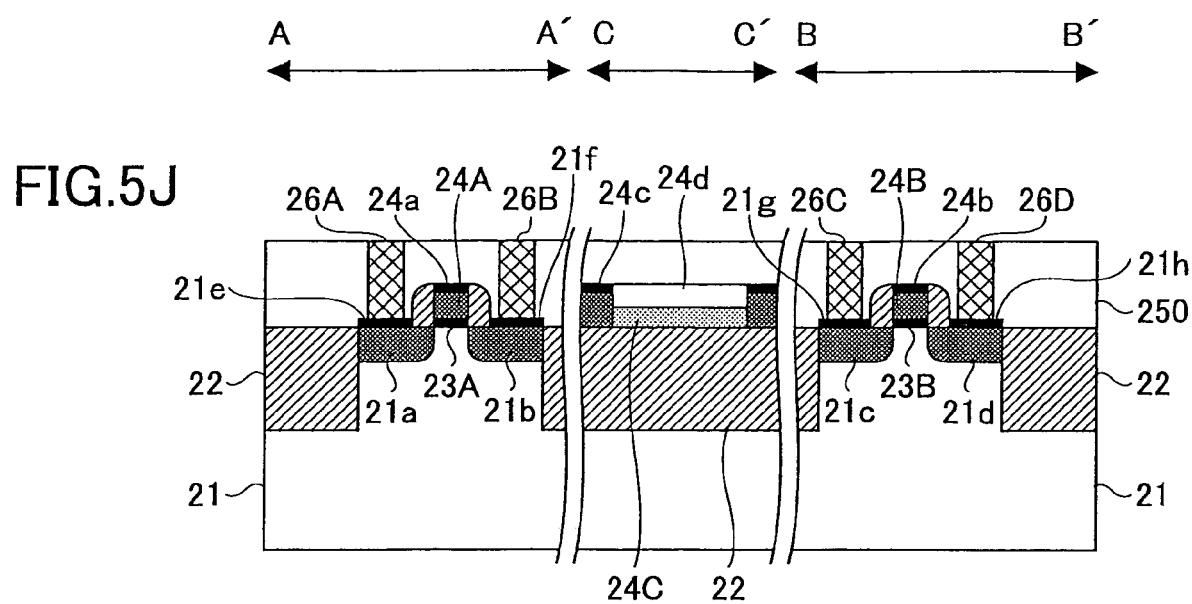

Further, in the step of FIG. 5J, an interlayer insulation film 250 is formed on the structure of FIG. 5I and via-plugs 26A and 26B are formed in the interlayer insulation film 250 in contact with the diffusion regions 21a and 21b via the silicide layers 21e and 21f. Further, in the interlayer insulation film 250, there are formed via plugs 26C and 26D in contact with the diffusion regions 21c and 21d via the silicide layers 21g and 21h.

Figure 7:
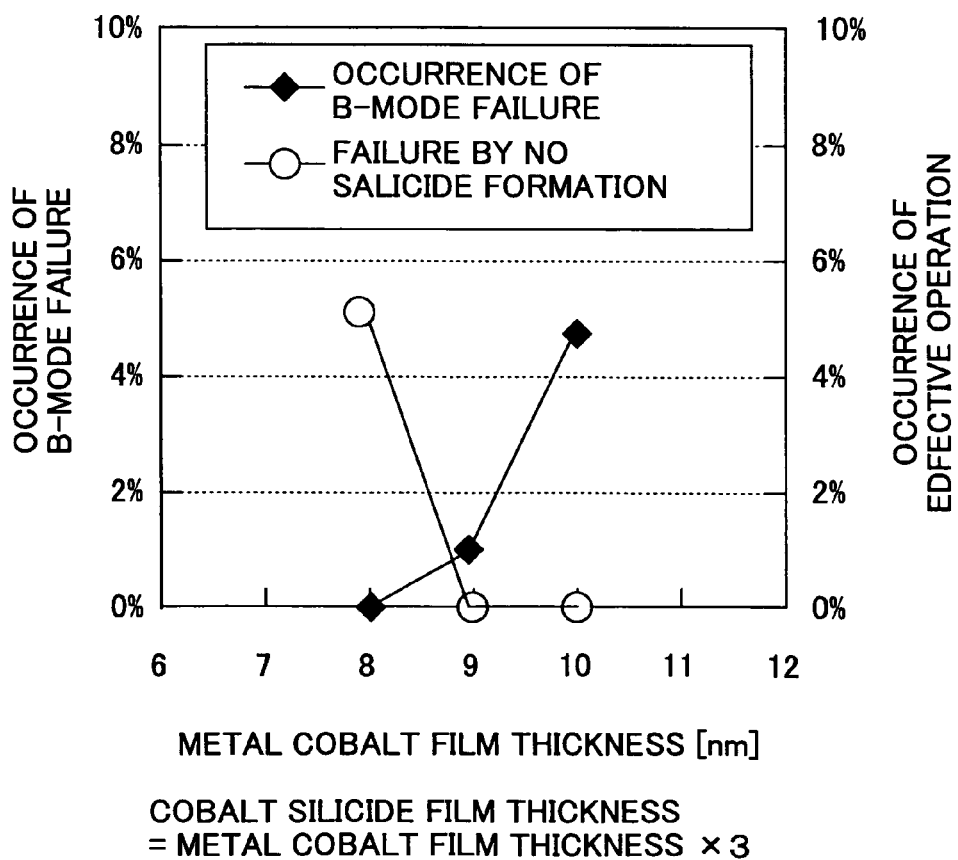
FIG. 7 is a diagram showing the relationship between the thickness of the metal film in the salicide process, the occurrence of B-mode failure and the occurrence of defective operations.

FIG. 7 shows the occurrence of B-mode failure and occurrence of defective operation caused by failure of silicide formation for the CMOS device 10 explained previously with reference to FIGS. 2A and 2B for the case the thickness of the metallic film deposited in the step corresponding to the step of FIG. 5E for the formation of the silicide layer 14a is changed variously.

Figure 1A:
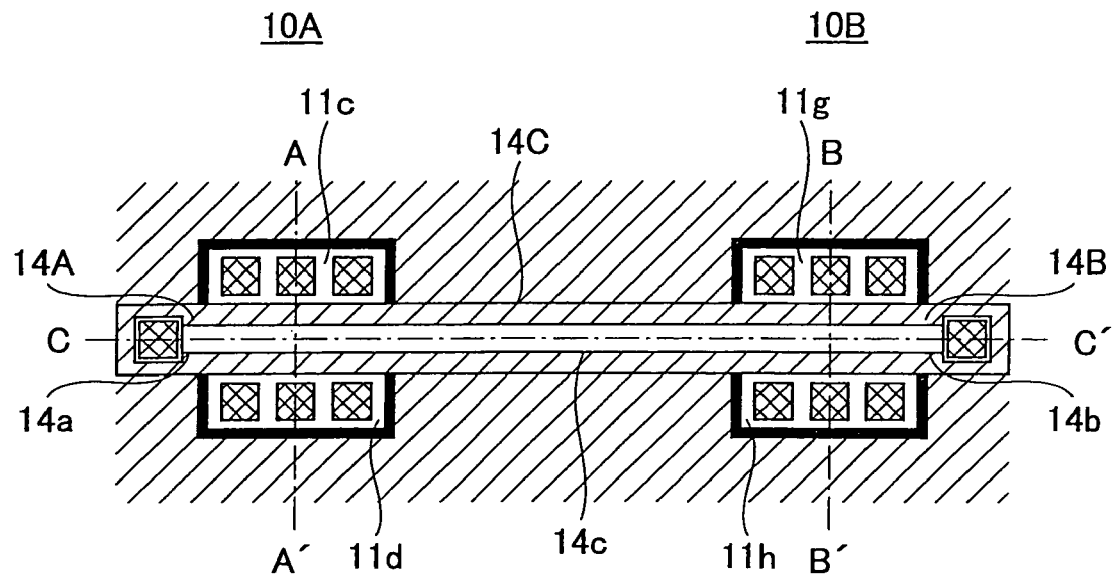
FIGS. 1A and 1B are diagrams showing the construction of a conventional CMOS device.
Figure 1B:
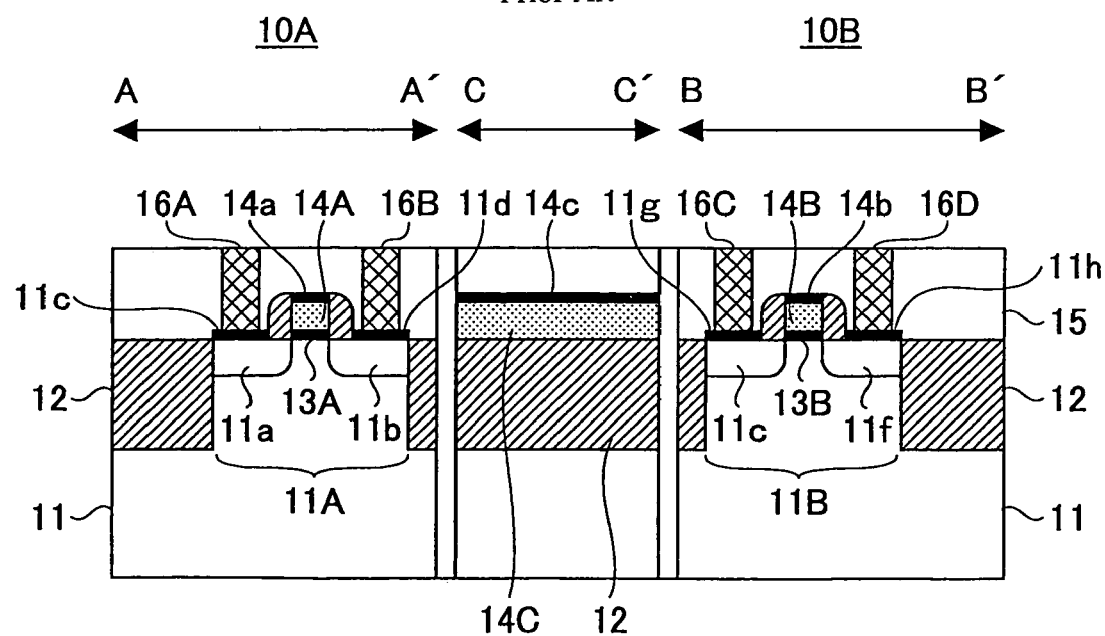
Figure 2A:
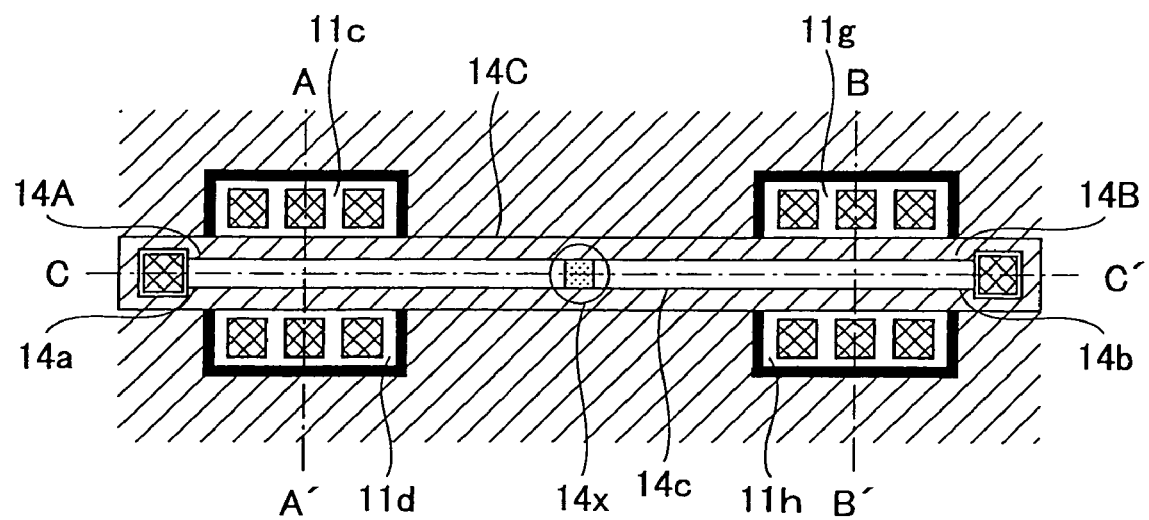
FIGS. 2A and 2B are diagrams explaining the problems encountered when device miniaturization is made in the conventional CMOS device.
Figure 2B:
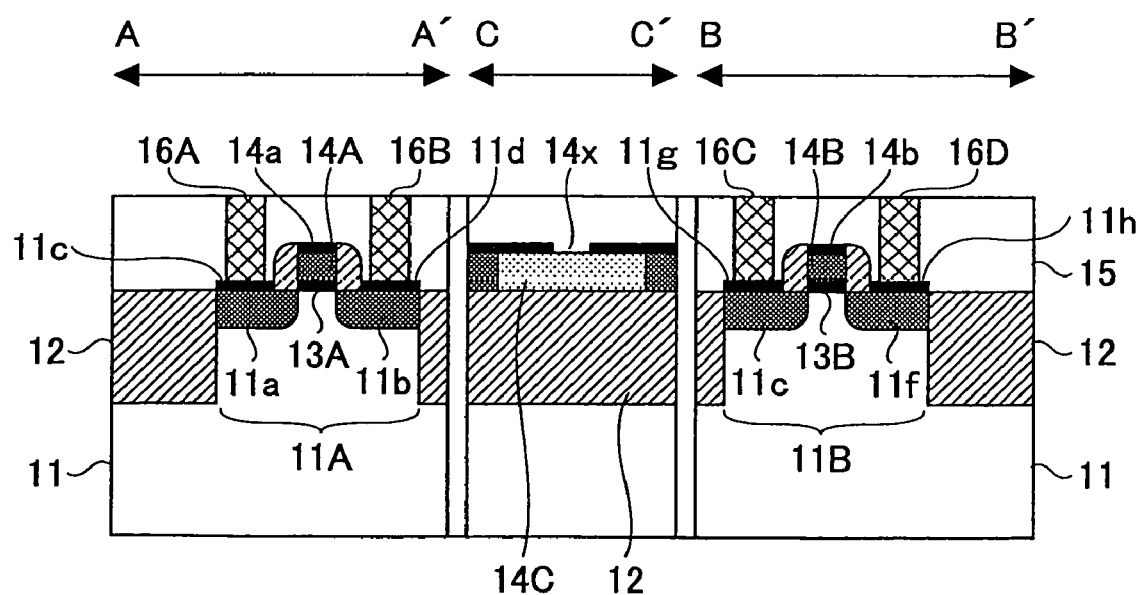
Figure 3:
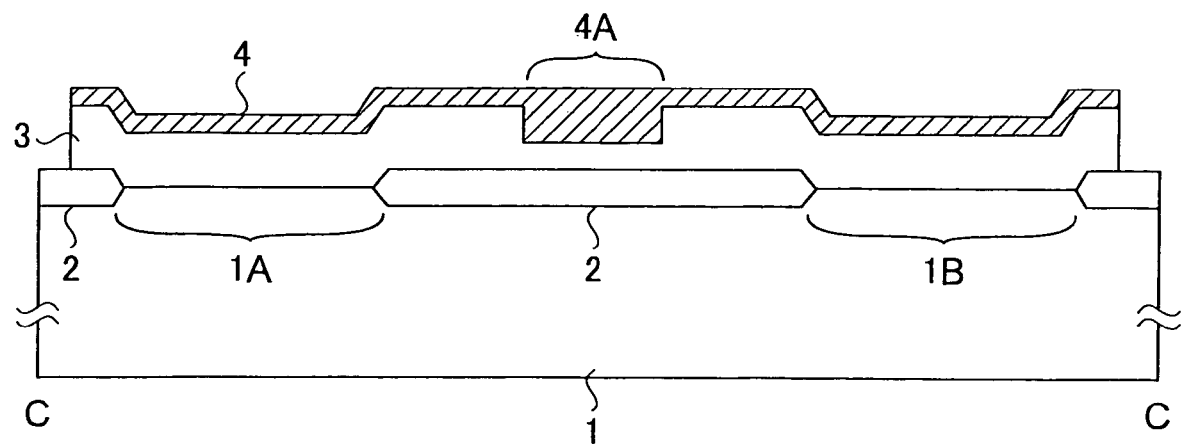
FIG. 3 is a diagram showing an example of a conventional polysilicon interconnection pattern.

Referring to FIG. 7, it will be noted that the occurrence of the B-mode failure is decreased when the thickness of the metallic film is decreased, while there occurs an increase in the defective operation caused by the failure of silicide formation explained with reference to FIGS. 2A and 2B with such decrease of thickness of the metallic film. When the metallic film has a large thickness, on the other hand, the defective operation caused by failure of silicide formation is decreased, while it can be seen that there occurs increase of B-mode failure.

In the present embodiment, the thickness of the metallic cobalt film 25 formed on the gate electrodes 24A and 24B is reduced to 8 nm or less in the step of FIG. 8H, and thus, the occurrence of the B-mode failure is reduced substantially to zero. Further, the occurrence of the defective operation of the CMOS device caused by the failure of silicide formation on the polysilicon pattern 24C is also suppressed with the present invention to substantially zero by setting the thickness of the cobalt film in the region 25A of increased thickness to 10 nm or more.

In the process of the Patent Reference 1 in which the titanium film is formed uniformly with the thickness of 300 Angstroms (30 nm) for the silicide formation reaction, on the other hand, formation of the B-mode failure is not suppressed in the case the process of the reference is applied to ultrafine semiconductor devices in which the thickness of the gate electrode is reduced.

While the foregoing embodiment has been explained for the case of formation of a cobalt silicide film, the present invention is not limited to such a specific material but is applicable also to the formation of other silicide films including a titanium silicide film, a nickel silicide film, a tungsten silicide film, a molybdenum silicide film, a zirconium silicide film, and the like.

In the present invention, there is formed a step in the metal film deposited for the silicide formation by conducting a patterning process prior to the silicide formation reaction, and thus, it becomes possible to secure a large difference of film thickness in the silicide layer between the region 24d of increased thickness and the region other than the foregoing region 24d, and thus, it becomes possible to secure a sufficient film thickness for the silicide layer formed on the polysilicon pattern 24C while simultaneously minimizing the thickness of the silicide layer on the gate electrodes 24A and 24B.

In relation to this, it should be noted that the present invention is particularly useful in the ultrafine semiconductor devices having a gate length of 130 nm or less and the thickness of the gate insulation film is 2 nm or less.

Further, it should be noted that the present invention is not limited to a CMOS device but also to semiconductor device in general as long as there is formed an extension of a polysilicon pattern from the polysilicon gate electrode of the p-channel MOS transistor or the n-channel MOS transistor.

Further, the present invention is not limited to the embodiments explained heretofore, but various variations and modifications may be made without deporting from the scope of the invention.

What is claimed is:

1. A semiconductor device, comprising:
   a substrate having first and second device regions separated from each other by a device isolation region;
   a first field effect transistor having a first polysilicon gate electrode and formed in said first device region;
   a second field effect transistor having a second polysilicon gate electrode and formed in said second device region;
   a polysilicon pattern extending over said device isolation region from said first polysilicon gate electrode to said second polysilicon gate electrode; and
   a silicide layer formed on a surface of said first polysilicon gate electrode, a surface of said second polysilicon gate electrode and a surface of said polysilicon pattern so as to extend on said polysilicon pattern from said first polysilicon gate electrode to said second polysilicon gate electrode,
   said silicide layer having a region of increased film thickness on said polysilicon pattern,
   wherein said silicide layer has a surface protruding upward in said region of increased film thickness.

2. The semiconductor device as claimed in claim 1, wherein said silicide layer has a thickness of 24 nm or less in a part thereof other than said region of increased thickness, said silicide layer having a thickness of 30 nm or more in said region of increased thickness.

3. The semiconductor device as claimed in claim 1, wherein said silicide layer comprises cobalt silicide.

4. The semiconductor device as claimed in claim 1, wherein said silicide layer comprises any of cobalt silicide, nickel silicide, titanium silicide, tungsten silicide, molybdenum silicide, and zirconium silicide.

5. The semiconductor device as claimed in claim 1, wherein said first and second field effect transistors have a gate insulation film having a thickness of 2 nm or less.

6. The semiconductor device as claimed in claim 1, wherein said first and second field effect transistors have a gate length of 130 nm or less.

7. A semiconductor device, comprising:
   a substrate having a device region defined by a device isolation region;
   a field effect transistor having a polysilicon gate electrode and formed on said device region;
   a polysilicon pattern extending out from said polysilicon gate electrode and extending over said device isolation region; and
   a silicide layer formed on a surface of said polysilicon gate electrode and on a surface of said polysilicon pattern so as to extend over said polysilicon pattern from said polysilicon gate electrode,
   said silicide layer including a first region of a first film thickness and a second region of a second, larger film thickness over said device isolation region, said silicide layer having a surface protruding upward in said second region with respect to said first region.

* * * * *